United States Patent [19]

Bylsma et al.

[11] Patent Number: 5,956,360
[45] Date of Patent: Sep. 21, 1999

[54] UNCOOLED LASERS WITH REDUCED LOW BIAS CAPACITANCE EFFECT

[75] Inventors: Richard Bendicks Bylsma, Allentown; John Michael Geary, Longswamp Township, Berks County, both of Pa.; Robert Louis Hartman, Warren Township, Somerset County, N.J.; Venkataraman Swaminathan, North Andover, Mass.; Daniel Paul Wilt, Orefield, Pa.

[73] Assignee: Lucent Technologies Inc., Murray Hill, N.J.

[21] Appl. No.: 08/828,918

[22] Filed: Mar. 28, 1997

[51] Int. Cl.⁶ ...................................................... H01S 3/19
[52] U.S. Cl. ............................................. 372/45; 372/46
[58] Field of Search ........................................ 372/45, 46

[56] References Cited

U.S. PATENT DOCUMENTS

| | | | |
|---|---|---|---|
| 4,597,085 | 6/1986 | Mito et al. | 372/45 |
| 4,751,719 | 6/1988 | Mito et al. | 372/46 |
| 4,866,723 | 9/1989 | Van Dongen | 372/46 |
| 4,870,650 | 9/1989 | Mink | 372/46 |
| 5,278,858 | 1/1994 | Brillouet et al. | 372/46 |
| 5,559,820 | 9/1996 | Kimura et al. | 372/46 |
| 5,561,681 | 10/1996 | Nishimura | 372/46 |
| 5,602,862 | 2/1997 | Barnsley et al. | 372/46 |
| 5,692,002 | 11/1997 | Mizutani | 372/46 |

*Primary Examiner*—Rodney Bovernick
*Assistant Examiner*—Quyen Phan Leung
*Attorney, Agent, or Firm*—Lester H. Birnbaum

[57] ABSTRACT

The invention is a laser with improved turn-on time for digital applications. The low bias capacitance effect of the laser is reduced by use of a buffer region formed between the substrate and the active region, the buffer region having a lower dopant concentration than the substrate.

8 Claims, 3 Drawing Sheets

UNCOOLED LASERS WITH REDUCED LOW BIAS CAPACITANCE EFFECT

FIELD OF THE INVENTION

This invention relates to semiconductor lasers, and in particular to uncooled lasers.

BACKGROUND OF THE INVENTION

Uncooled semiconductor lasers of various types are used in a variety of digital lightwave communications systems primarily due to their cost effectiveness. One example is the capped mesa buried heterostructure (CMBH) distributed feedback (DFB) laser. While such lasers are generally effective, the devices can exhibit eye closure and bit error rate problems when operated at low bias (typically less than 3 milliamps) necessitated when operated at low temperature (typically less than −20 degrees C.). This problem, is also known as the low bias capacitance effect.

It is, therefore, desirable to reduce the adverse effects of low temperature and low bias in uncooled lasers.

SUMMARY OF THE INVENTION

The invention is a semiconductor laser formed on a semiconductor substrate of a certain conductivity type and including an active region for producing light when a bias is supplied thereto. Formed between the active region and substrate is a cladding region which is doped with an impurity of said conductivity type. Formed between the cladding region and substrate is a buffer region doped with an impurity of the same conductivity type, but having a lower impurity concentration than the substrate.

BRIEF DESCRIPTION OF THE DRAWINGS

These and other features of the invention are delineated in detail in the following description. In the drawing.

It will be appreciated that, for purposes of illustration, these figures are not necessarily drawn to scale.

DETAILED DESCRIPTION

Figure 1:
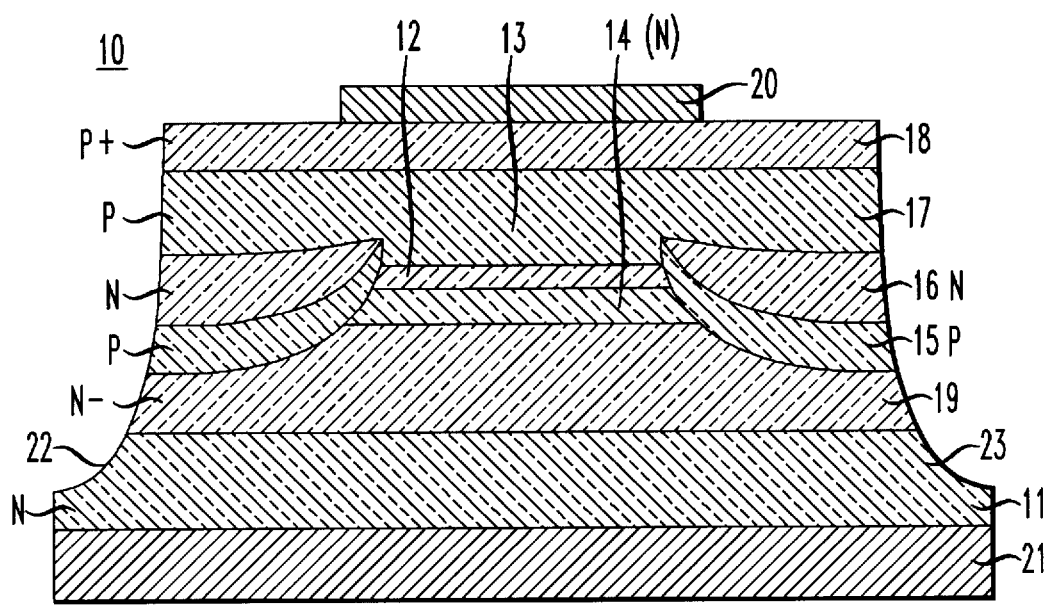
FIG. 1 is a cross-sectional view of a device in accordance with an embodiment of the invention.

Referring now to the drawings, in which like reference numerals identify similar or identical elements, FIG. 1 illustrates a distributed feedback laser, 10, which incorporates features of the invention. The laser in this example is formed on a substrate, 11, which is an n-type InP material, typically having a dopant concentration within the range $2-6\times10^{18}$ per cm$^3$. The laser structure is known in the art as a capped mesa buried heterostructure (CMBH) and comprises an InGaAsP active region, 12, where the laser light is generated when an electrical bias is supplied thereto. The active region, 12, is typically undoped (but could be doped), and includes a distributed feedback grating (not shown). The active region, 12, is sandwiched between a top InP cladding region, 13, having a p-type conductivity, and a bottom InP cladding region, 14, having an n conductivity type. The top cladding region, 13, typically has a dopant concentration within the range $8\times10^{17}$ to $3\times10^{18}$ per cm$^3$. The bottom cladding region, 14, typically has a dopant concentration within the range $8\times10^{17}$ to $3\times10^{18}$ per cm$^3$.

The mesa structure is bounded by blocking layers, 15 and 16. In this example, layer 15 is a p-type conductivity InP region with a concentration within the range $8\times10^{17}$ to $3\times10^{18}$ per cm$^3$, and layer 16 is an n-type conductivity InP region with a concentration also within the range $8\times10^{17}$ to $3\times10^{18}$ per cm$^3$. It will be appreciated that the number and conductivity of the blocking layers, as well as the dopant concentrations, can be varied. The laser is capped by an additional layer of p-type InP, 17, which becomes an extension of region 13, and by a further layer, 18, of p plus-type InGaAs formed over layer 17. Metal contacts, 20 and 21, are formed on the surfaces of the layer, 18, and substrate, 11, respectively. Trenches 22 and 23 are formed on the edges of the device in order to shorten the length of the boundary between layers 15 and 19 and thereby provide some reduction in low bias temperature effect.

In accordance with a feature of the invention, a buffer layer, 19, is included beneath and contiguous with the cladding region, 14, and the blocking layer, 15, and over the substrate 11. The buffer layer, 19, has the same conductivity type as the cladding region, 14, and substrate, 11, i.e., n-type, but has a lower dopant concentration than the substrate. For example, the concentration of the buffer layer is typically in the range $1\times10^{17}$ to $5\times10^{17}$ cm$^3$, and in any event is at least a factor of 2 less than the substrate, 11.

Figure 2:
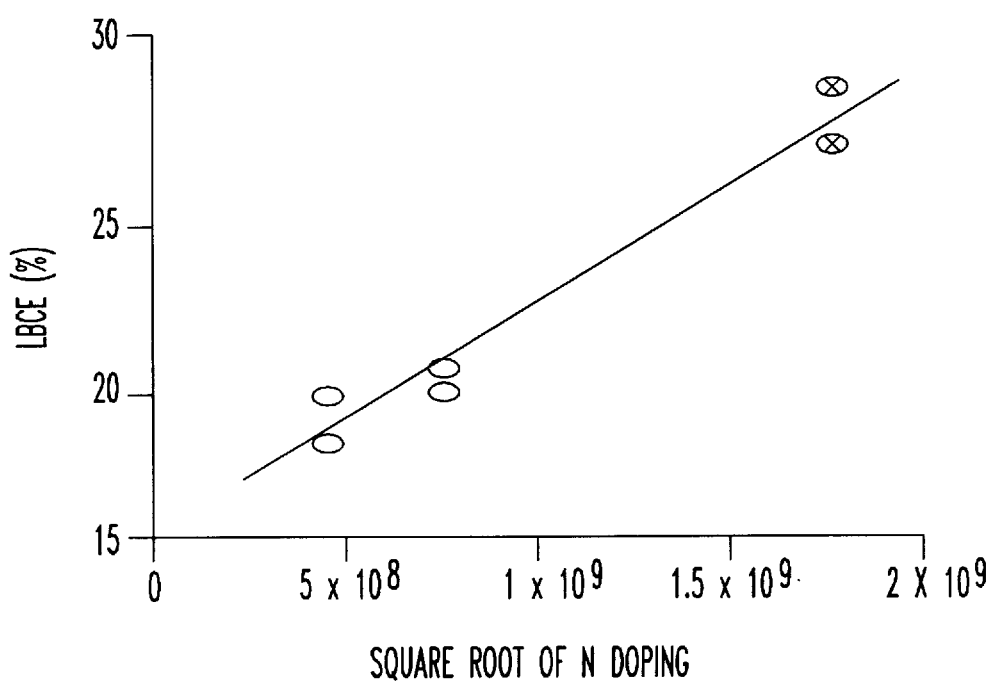
FIG. 2 is a graph of a property of the device as a function of doping of the buffer region in accordance with the same embodiment.

The benefit derived from the buffer layer, 19, can be noted from an inspection of the graph of FIG. 2 which is a graph of the low bias capacitance effect (LBCE) as a function of the square root of the doping concentration of the area beneath the cladding region, 14, and blocking layer, 15. The LBCE is defined as the difference between the intensity of the laser light at the initial turn-on of the laser and the final intensity of the laser light at its steady state value divided by the final intensity of the laser light at its steady state value. Thus, it is desired to make LBCE as small as possible to achieve high bit rates. It will be noted that prior art devices, indicated by "X" in the graph, which had a high dopant concentration (since the cladding region, 14, and blocking layers were bounded by the substrate, 11) exhibited an LBCE of typically 25 to 30 percent. However, devices employing the low-doped buffer region, 19, indicated by "o" on the graph, typically exhibited an LBCE of less than 18 percent.

Figure 3:
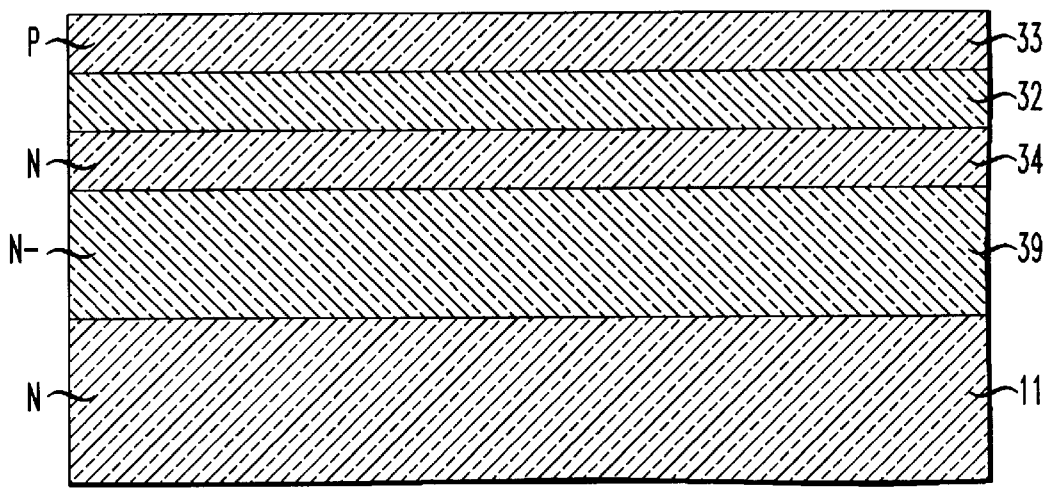
FIGS. 3–6 are cross-sectional views of a device in various stages of fabrication in accordance with the same embodiment.

FIGS. 3–6 illustrate various stages of fabrication of the device of FIG. 1 in accordance with a typical manufacturing sequence. As illustrated in FIG. 3, a layer, 39, of n minus-type InP is first grown epitaxially on the surface of the InP substrate, 11, by standard techniques. This layer, which will be formed into the buffer region, 19 of FIG. 1, is typically approximately 3 microns thick and has the dopant concentration previously specified. Formation of layer, 39, is followed by successive epitaxial growth of a layer, 34, of n type InP, a layer, 32, of undoped InGaAsP (which could be doped if desired), and a layer, 33, of p-type InP. These layers typically have thicknesses of 1 μm, 200 Å, and 0.5 μm, respectively. Layer, 34, has a dopant concentration previously specified for cladding region, 14, and layer 33 has a dopant concentration previously specified for cladding region, 13.

Figure 4:
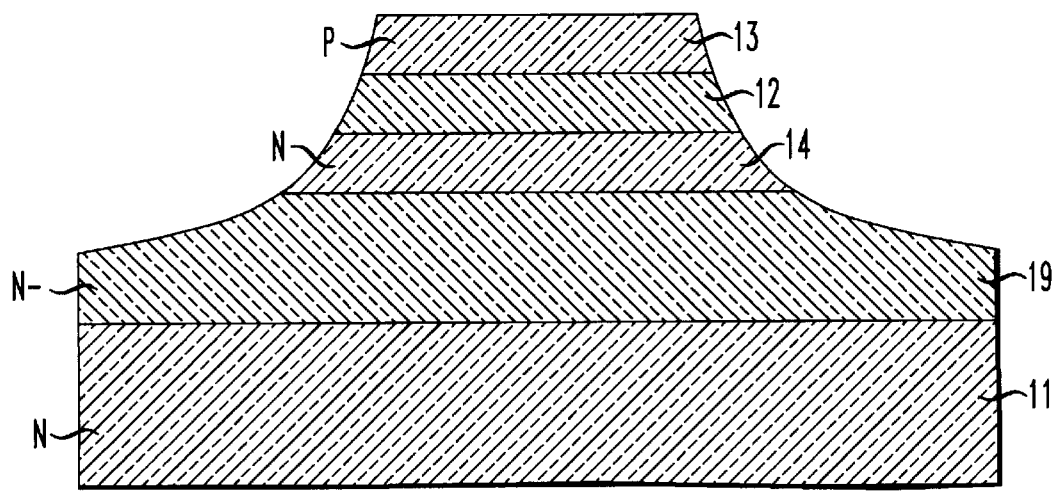
Figure 5:
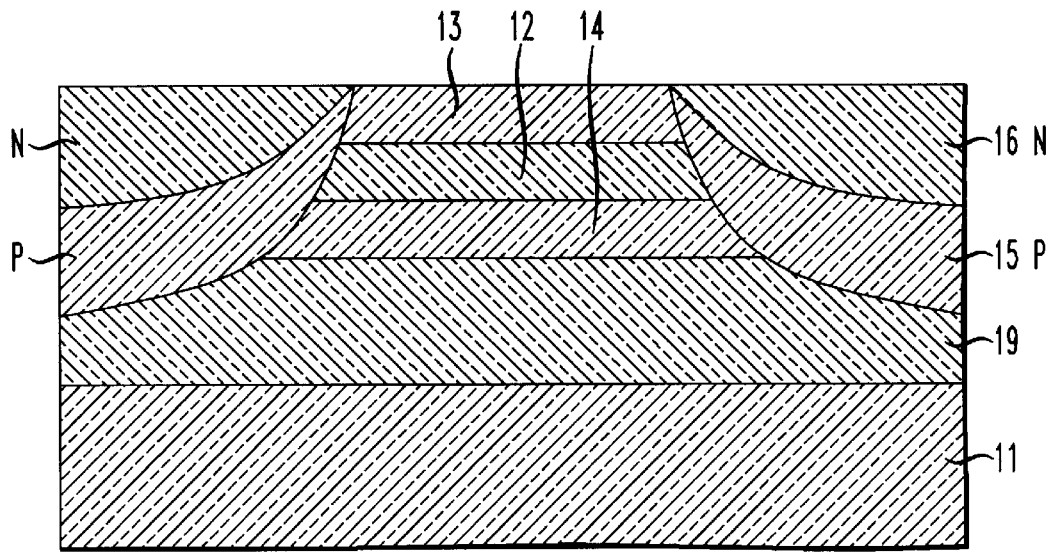
Figure 6:
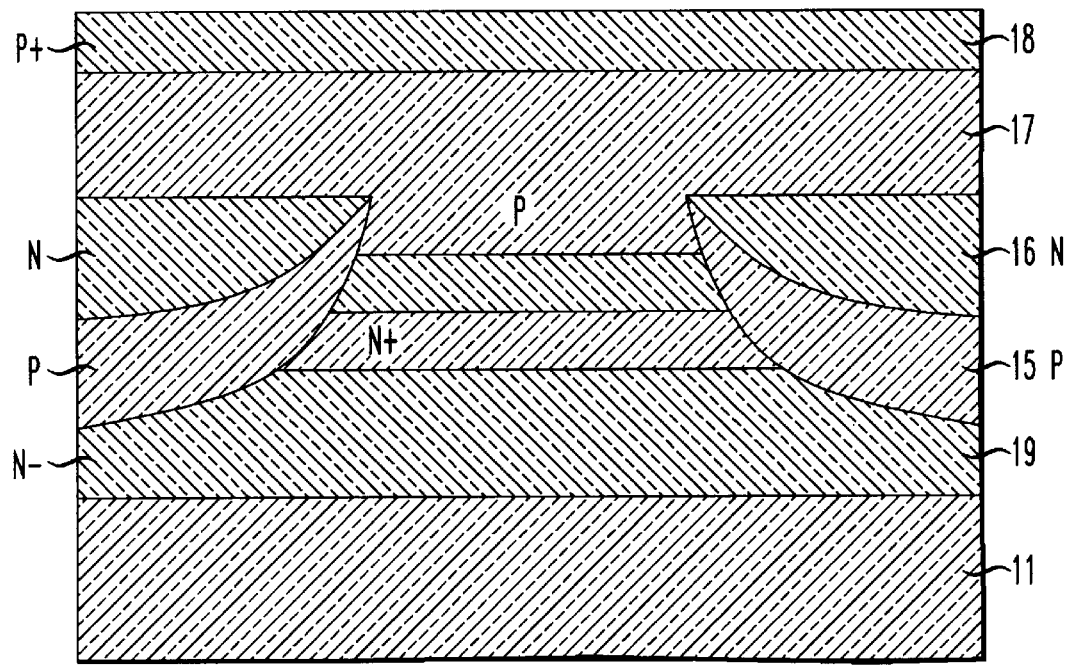

As illustrated in FIG. 4, the regions 12–14 and 19 are defined by etching the layers 32–34 and 39 by means of a mask (not shown) using standard techniques in order to produce a mesa structure. Following etching, the blocking layers, 15 and 16, are formed by epitaxial growth of successive layers of p-type and n-type InP layers on the etched areas as illustrated in FIG. 5. The layers 15 and 16 typically have a thickness of 4 microns. Next, as illustrated in FIG. 6, the layer, 17, is formed by epitaxial growth of a p-type InP material on the surface of region 13 and blocking layer 16 to a typical thickness of approximately 2 microns. This is followed by a final epitaxial growth of a p plus-type InGaAs layer, 18, on the surface of the layer 17 to a typical thickness of approximately 0.5 microns. The device is completed by the formation of trenches (22 and 23 of FIG. 1) by standard wet chemical techniques and the deposition of standard metal contacts, 20 and 21 of FIG. 1, on the layer 18 and the substrate, 11.

It should be appreciated that, although the invention has been described in terms of a capped mesa buried heterostructure laser, the invention could be advantageous for any uncooled laser used for digital transmission where it is desired to reduce the turn-on time of the laser. In other types of structures, it may be desirable to form the buffer layer by techniques other than epitaxial growth, such as ion implantation. Of course, semiconductor materials other than those specifically described could be used.

While the embodiment described shows the use of trenches, 22 and 23, to and in lowering the low bias capacitance effect, devices may be fabricated without the trenches and still result in a significant lowering of the LBCE.

The invention claimed is:

1. A semiconductor laser comprising:

a semiconductor substrate doped with impurities having a certain conductivity type;

an active region for producing light when a bias is supplied thereto;

a cladding region between the active region and substrate, and doped with impurities having the same conductivity type as the substrate; and a buffer region formed between the cladding region and substrate, the buffer region being doped with impurities having the same conductivity type as the cladding region and the substrate but having a lower impurity concentration than the cladding region and the substrate.

2. The laser according to claim 1 wherein the cladding region is contiguous with the active region, and the buffer region is contiguous with the cladding region and with the substrate.

3. The laser according to claim 1 wherein the active region is formed in a mesa structure which is bounded by at least one blocking layer, and the buffer region is contiguous with one of the blocking layers.

4. The laser according to claim 1 wherein the cladding region has a dopant concentration within the range $8\times10^{17}$ to $3\times10^{18}$, the substrate has a dopant concentration within the range $2-6\times10^{18}$, and the buffer region has a dopant concentration within the range $1\times10^{17}$ to $5\times10^{17}$ per $cm^3$.

5. The laser according to claim 1 wherein the dopant concentration of the buffer region is at least a factor of two less than the dopant concentration of the substrate.

6. The laser according to claim 1 wherein the laser exhibits a low bias capacitance effect of less than 20 percent.

7. The laser according to claim 1 wherein the cladding region, substrate, and buffer region comprise InP.

8. The laser according to claim 1 further comprising an additional cladding region doped with impurities having an opposite conductivity, and a capping region contiguous with the additional cladding region and also doped with impurities having an opposite conductivity type.

* * * * *